United States Patent
Takeda

(10) Patent No.: US 6,750,793 B2
(45) Date of Patent: Jun. 15, 2004

(54) DECIMATION FILTER AND INTERPOLATION FILTER

(75) Inventor: Yukihito Takeda, Kagamihara (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/668,631

(22) Filed: Sep. 23, 2003

(65) Prior Publication Data

US 2004/0059764 A1 Mar. 25, 2004

(30) Foreign Application Priority Data

Sep. 25, 2002 (JP) ........................................ 2002-279020

(51) Int. Cl.[7] ............................................. H03M 1/00
(52) U.S. Cl. .................... 341/126; 341/143; 708/313
(58) Field of Search ..................... 341/126, 61, 143, 341/144, 155; 708/313, 300, 301

(56) References Cited

U.S. PATENT DOCUMENTS 5,717,617 A * 2/1998 Chester ...................... 708/313
5,729,483 A * 3/1998 Brown ........................ 708/313
5,732,004 A * 3/1998 Brown ........................ 708/319
5,751,615 A * 5/1998 Brown ........................ 708/313
5,907,295 A * 5/1999 Lin ............................... 341/61

* cited by examiner

*Primary Examiner*—Brian Young
*Assistant Examiner*—John B Nguyen
(74) *Attorney, Agent, or Firm*—Hogan & Hartson, LLP.

(57) ABSTRACT

A decimation filter in which a coefficient word length of a last-stage FIR filter is shorter than that which attains a necessary attenuation rate, and an interpolation filter in which a coefficient word length of a first-stage FIR filter is the same. The coefficient is arranged such that a region in which attenuation is insufficient is caused intensively around a Nyquist frequency. The attenuation in such a region relative to the first or last-stage FIR filter is enhanced so as to ensure sufficient attenuation, by its preceding or following FIR filter. As a result, sufficient attenuation is maintained in an inhibition region while maintaining a relatively small circuit size.

8 Claims, 10 Drawing Sheets

DECIMATION FILTER AND INTERPOLATION FILTER

BACKGROUND OF THE INVENTION

1. Field of the Invention

The present invention relates to a decimation filter for analogue-digital conversion and to an interpolation filter for digital-analogue conversion, and in particular to rationalization of coefficient word length in an FIR filter.

2. Description of the Related Art

Conventionally, a decimation filter is used for A/D conversion, while an interpolation filter is used for D/A conversion. In particular, a decimation filter comprising 1/2x down sampling FIR filters in cascade connection and an interpolation filter comprising 2x over sampling FIR filters in cascade connection are commonly used.

FIG. 1 shows a structure of a standard FIR filter. As shown, a signal is sequentially supplied to a plurality of serially connected $z^{-1}$ delay units 1, which then sequentially create estimates based on the signal to respectively output delayed signals. The signals output from the respective $z^{-1}$ delay units 1 are supplied to their corresponding coefficient multipliers 2, where the signal is multiplied by respective predetermined coefficients a0, a1, . . . , before being supplied to a common adder 3. The adder 3 adds the signals, or delayed data, with predetermined weight. In the above, the adder 3 outputs filtering outputs, depending on a coefficient of the coefficient multiplier 2.

FIG. 2 shows an example of an interpolation filter, in which 2x over sampling FIR filters 4-1 to 4-3 are connected in a three-stage cascade relationship for conversion of digital data having 1 fs (sampling frequency) into digital data having 8 fs. This structure is often employed for conversion of digital data having 1 fs into digital data having 8 fs since it can be realized using a smaller hardware than a structure using an 8x over sampling FIR filter.

FIGS. 3 to 5 show example characteristics of a 4x interpolation filter comprising 2x over sampling FIR filters 4-1 to 4-2 in two-stage cascade connection. FIG. 3 relates to a characteristic of a first-stage FIR filter 4-1, FIG. 4 relates to a characteristic of a second-stage FIR filter 4-2, and FIG. 5 relates to the overall characteristic of the complete filter. A coefficient word length of the first-stage FIR filter 4-1 is 16 bits and attenuation in an inhibition zone of the entire filter is −64.5 dB. Comprehensive characteristics of the complete filter are substantially determined based on the attenuation by the first-stage FIR filter. Any increase of attenuation in an inhibition zone of the first-stage FIR filter 4-1 requires proportional increase of the circuit size. It should, however, be noted that the attenuation in an inhibition zone of a second-stage FIR filter 4-2 can be increased without significantly increasing the circuit size.

FIG. 6 shows an example of a standard decimation filter comprising 1/2x down sampling FIR filters 5-1 to 5-3 arranged in a three-stage cascade connection for conversion of digital data having 8 fs into digital data having 1 fs. Filter characteristic of a 1/4 decimation filter comprising 1/2x down sampling FIR filters 5-1 to 5-2 in two-stage cascade connection is identical to that shown in FIGS. 3 and 4. Specifically, a filter characteristic of the third-stage FIR filter 5-3 is shown in FIG. 3, that of an FIR filter immediately before the third-stage FIR filter 5-3, that is, the second-stage FIR filter 5-2, is shown in FIG. 4, and that of the complete filter is shown in FIG. 5.

An output $y_j$ of a FIR-type digital filter is expressed as $y_j = \Sigma h_i \cdot x_i (i=i,n)$, wherein $x_i$ denotes an input, $h_i$ denotes a filter coefficient, and n denotes the number of taps. A FIR-type digital filter generally requires a multiplier. When no multiplier is employed, a parallel shift adder is used for time-dividing multiplication. In this case, increasing the attenuation in an inhibition zone requires that a coefficient word length of the filter and the number of taps both be increased. In other words, as described above, the circuit size of the first-stage FIR filter of an interpolation filter and that of the last-stage FIR filter of a decimation filter are significantly increased.

A longer filter coefficient word lengths lead to larger multiplier circuit sizes. When a parallel shift adder is used, a longer period of time is required to complete an operation. Therefore, in order to complete an operation within a predetermined period of time, modification must be made so as to include, for example, two or more parallel shift adders. This results in an increase in the size of the circuit.

According to the present invention, FIR filters are arranged in a cascade connection in which the last-stage FIR filter (for a decimation filter) or the first-stage FIR filter (for an interpolation filter) is arranged so as to have a shorter coefficient word length than that which is necessary to attain a desired characteristic. Although this results in insufficient attenuation in an inhibition zone of the first-or last-stage FIR filter, it is arranged such that regions with insufficient attenuation relative to the first- or last-stage FIR filter are caused near the Nyquist frequency, and that the Nyquist frequency and nearby frequencies are attenuated by a FIR filter immediate following or preceding the FIR filter, so that sufficient attenuation can be ensured over the entire filter.

DESCRIPTION OF THE PREFERRED EMBODIMENT

In the following, a preferred embodiment of the present invention will be described with reference to the accompanied drawings.

Figure 1:
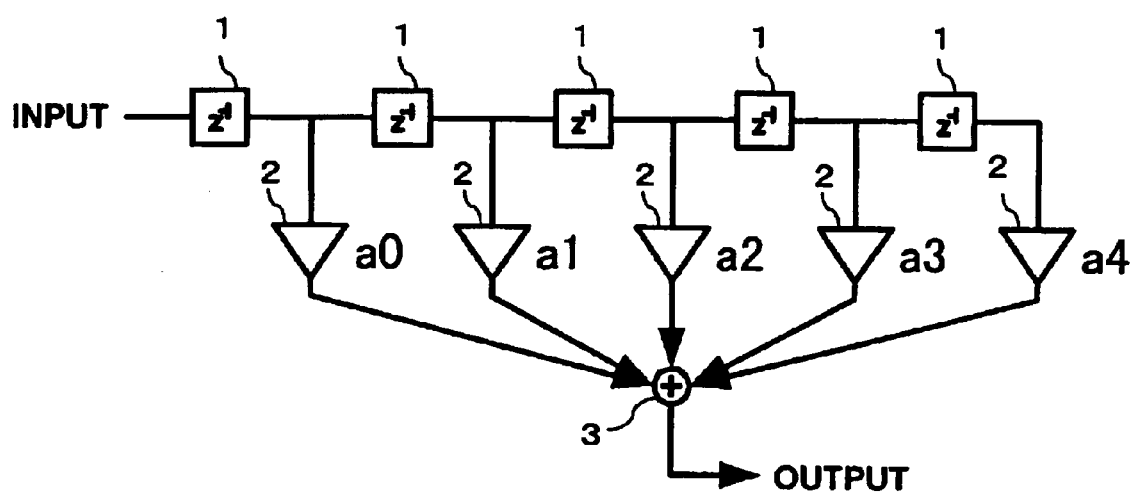
FIG. 1 is a diagram showing a structure of a typical FIR filter.
Figure 2:
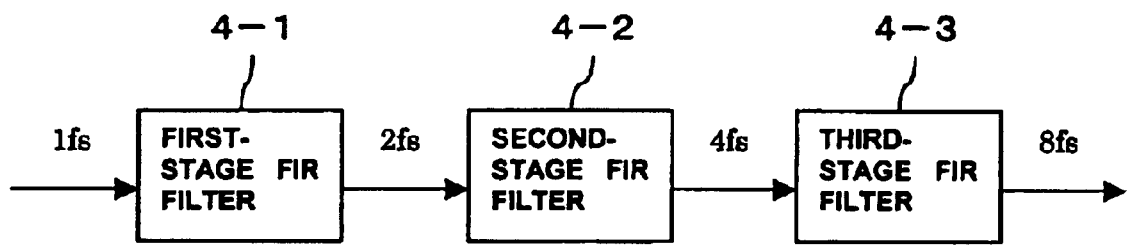
FIG. 2 is a block diagram showing a structure of a typical interpolation filter.

The hardware structure of an interpolation filter according to this embodiment is basically identical to that of FIG. 2, and specifically comprises three serially connected over sampling FIR filters 4-1 to 4-3. Each of the FIR filters 4-1 to 4-3 applies 2x over sampling whereby the sampling frequency, for example, 1 fs, of an input signal is doubled by the respective these filters 4-1 to 4-3 until a signal having a frequency of 8 fs is output. The structure of each of the FIR filters 4-1 to 4-3 is basically identical to of the structure shown in FIG. 1.

Here, the first-stage FIR filter 4-1 is arranged such that the number of figures of a coefficient (a coefficient word length) of its coefficient multiplier 2 is smaller than that of a typical FIR filter. That is, while the coefficient word length of the first-stage FIR filter 4-1 in FIG. 1 is 16 bits, that in this embodiment is 13 bits.

Figure 7:
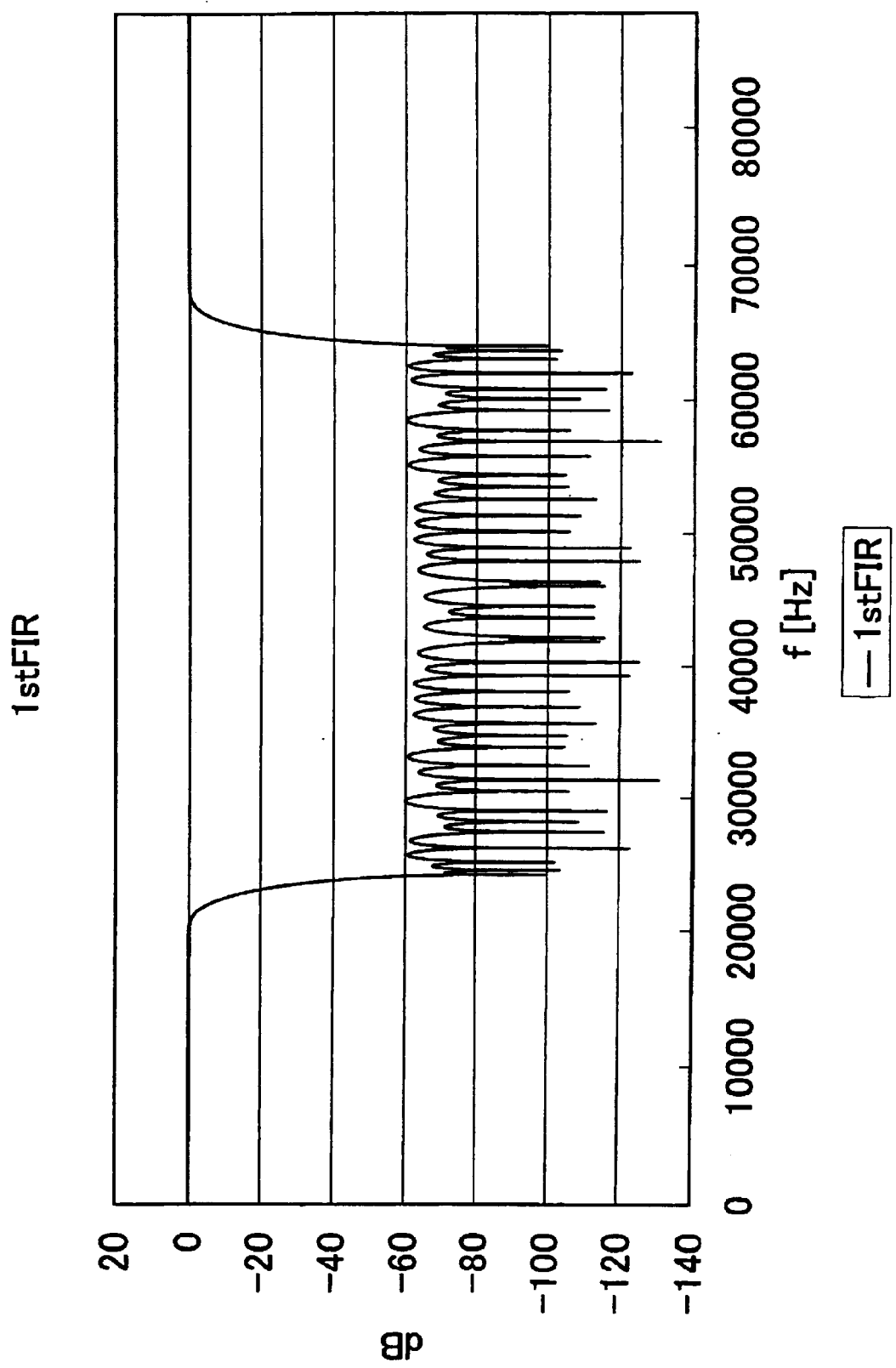
FIG. 7 is a diagram showing a filter characteristic of a typical first-stage FIR filter (coefficient length of 13 bits)

FIG. 7 shows a characteristic of the first-stage FIR filter 4-1 having the structure shown in FIG. 1 and a coefficient word length of 13 bits.

Figure 3:
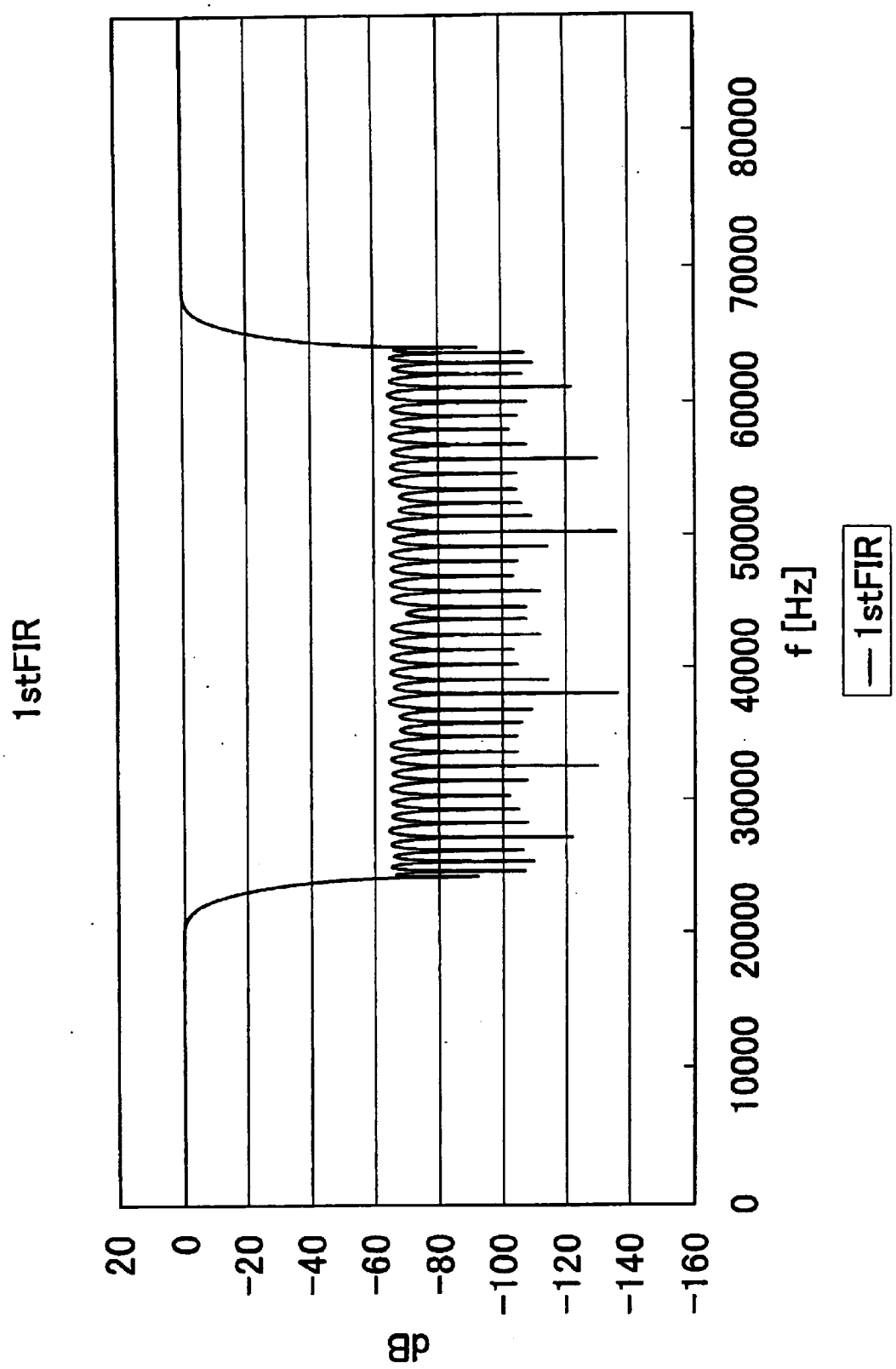
FIG. 3 is a diagram showing a filter characteristic of a first-stage FIR filter (coefficient length of 16bits) having the structure of FIG. 1.
Figure 4:
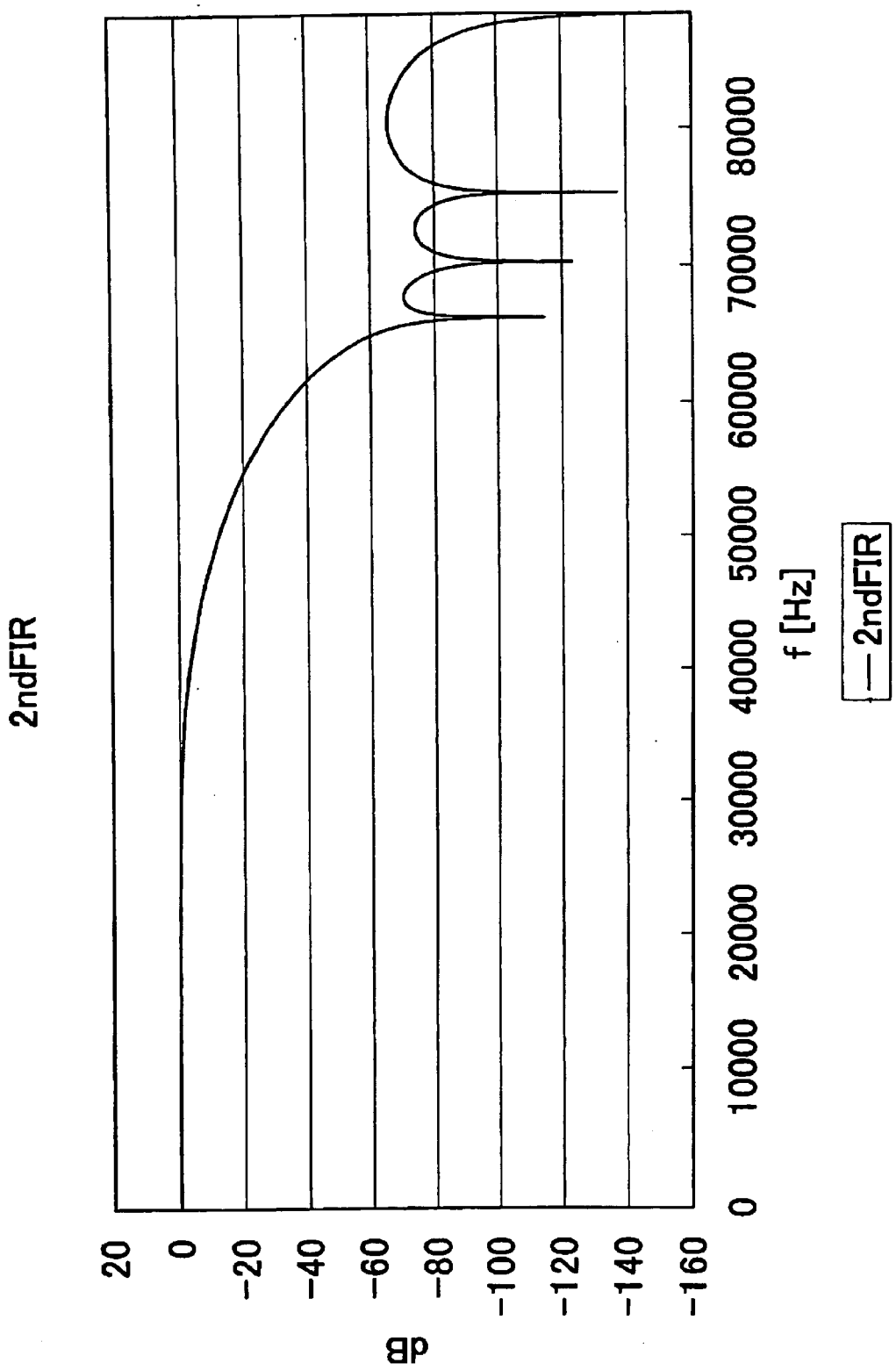
FIG. 4 is a diagram showing a filter characteristic of a second-stage FIR filter having the structure of FIG. 1.
Figure 5:
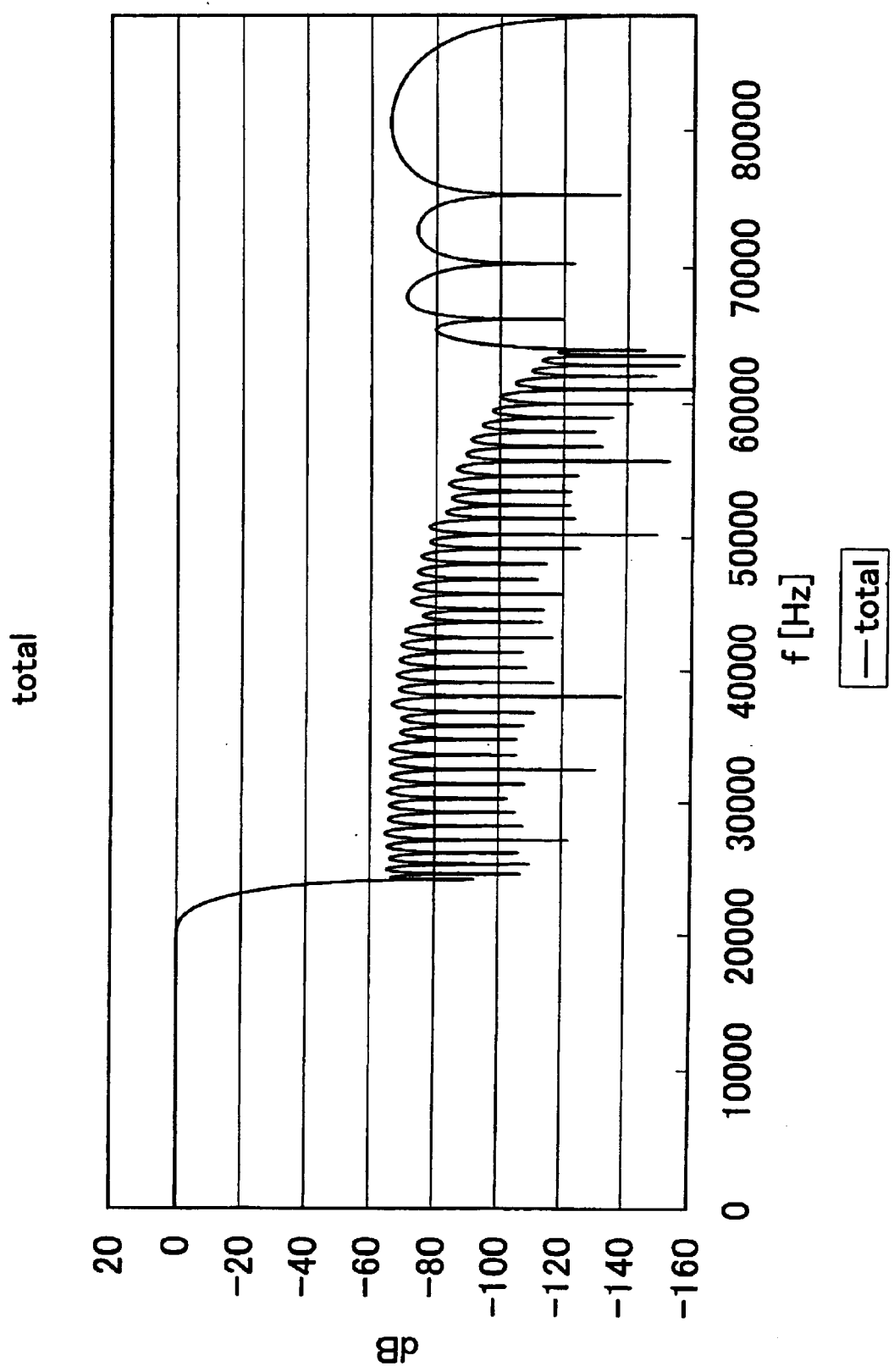
FIG. 5 is a diagram showing respective comprehensive filter characteristics of a first-stage FIR filter (coefficient length of 16 bits) and second FIR filter, respectively having the structure of FIG. 1.
Figure 8:
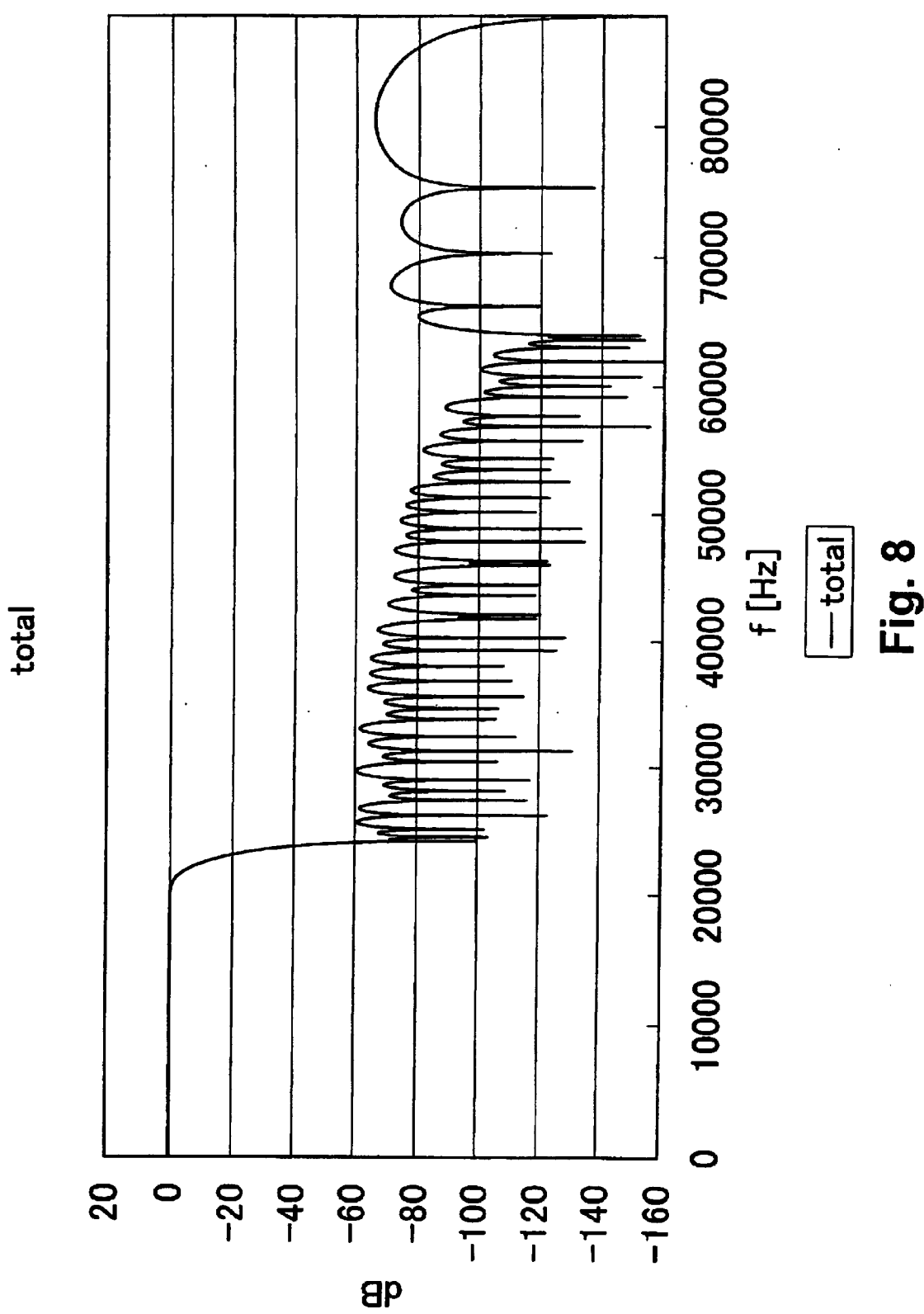
FIG. 8 is a diagram showing comprehensive filter characteristics of a typical first-stage FIR filter (coefficient length of 13 bits) and a typical second-stage FIR filter.

When the coefficient word length is simply shortened as described above, the resulted characteristic presents a more significant concavo-convex nature due to rounding-off error with the coefficient (a quantization error), as compared to the characteristic of FIG. 3. This results in insufficient attenuation in an inhibition zone. The comprehensive characteristic of the entire filter including the first-stage FIR filter 4-1 and the second-stage FIR filter 4-2 is shown in FIG. 8. As shown, attenuation in an inhibition zone of the entire filter is −60.4 dB, which is less by 4.1 dB than that of FIG. 5.

As described above, reduction of the coefficient word length of a filter results in deterioration in filter characteristics due to the influence of quantization errors.

In order to address this problem, in this embodiment, while the coefficient word length is set shorter than a typical length, for example, the coefficient word length may be set to 13 bits in the present embodiment, the coefficient of the coefficient multiplier 2 of the first-stage FIR filter 4-1 is set to values which differ from those in a conventional example. Specifically, coefficients of the first- and second-stage FIR filters 4-1 and 4-2 are set at values as shown in Table 1. It should be noted that, in this example, the first-stage FIR filter 4-1 has 79 stages, while the second-stage FIR filter 4-2 has 15 stages. The coefficient of the second-stage FIR filter 4-2 is the same as that of a conventional structure.

TABLE 1

| FIRST FIR | | SECOND FIR | |
|---|---|---|---|
| | COEFFICIENT | | COEFFICIENT |
| a0, a78 | −4/8192 | b0, b14 | −7/2048 |
| a1, a77 | 0 | b1, b13 | 0 |
| a2, a76 | 4/8192 | b2, b12 | 40/2048 |
| a3, a75 | 0 | b3, b11 | 0 |
| a4, a74 | −7/8192 | b4, b10 | −146/2048 |
| a5, a73 | 0 | b5, b9 | 0 |
| a6, a72 | 10/8192 | b6, b8 | 62/2048 |
| a7, a71 | 0 | b7 | 1024/2048 |
| a8, a70 | −15/8192 | | |
| a9, a69 | 0 | | |
| a10, a68 | 20/8192 | | |
| a11, a67 | 0 | | |
| a12, a66 | −27/8192 | | |
| a13, a65 | 0 | | |
| a14, a64 | 36/8192 | | |
| a15, a63 | 0 | | |
| a16, a62 | −47/8192 | | |
| a17, a61 | 0 | | |

TABLE 1-continued

| FIRST FIR | | SECOND FIR | |
|---|---|---|---|
| | COEFFICIENT | | COEFFICIENT |
| a18, a60 | 60/8192 | | |
| a19, a59 | 0 | | |
| a20, a58 | −76/8192 | | |
| a21, a57 | 0 | | |
| a22, a56 | 96/8192 | | |
| a23, a55 | 0 | | |
| a24, a54 | −121/8192 | | |
| a25, a53 | 0 | | |
| a26, a52 | 153/8192 | | |
| a27, a51 | 0 | | |
| a28, a50 | −196/8192 | | |
| a29, a49 | 0 | | |
| a30, a48 | 255/8192 | | |
| a31, a47 | 0 | | |
| a32, a46 | −345/8192 | | |
| a33, a45 | 0 | | |
| a34, a44 | 502/8192 | | |
| a35, a43 | 0 | | |
| a36, a42 | −857/8192 | | |
| a37, a41 | 0 | | |
| a38, a40 | 2604/8192 | | |
| a39 | 4096/8192 | | |

Figure 9:
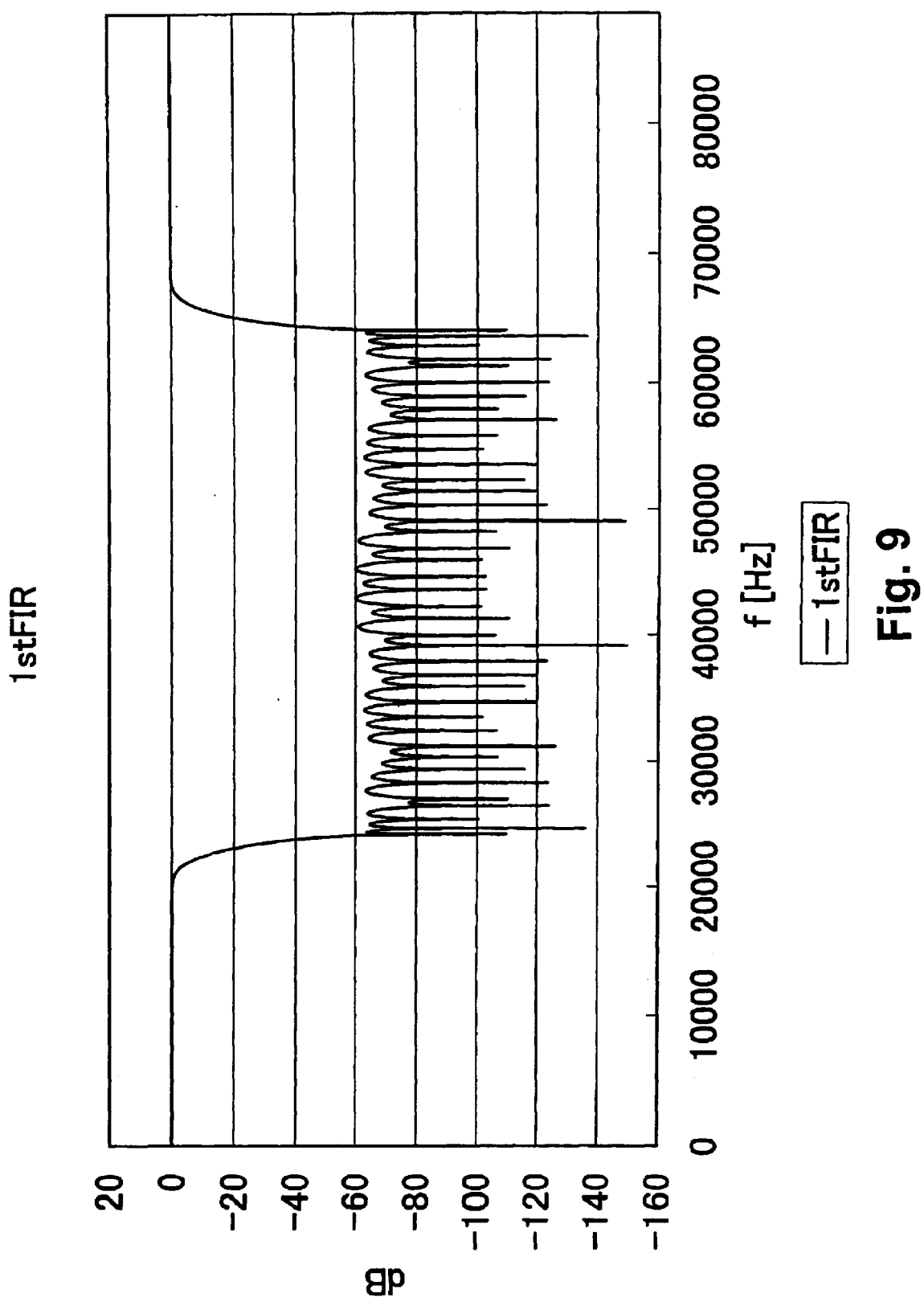
FIG. 9 is a diagram showing a filter characteristic of a first-stage FIR filter (coefficient length of 13 bits) in an embodiment of the present invention.

FIG. 9 shows characteristic of the first-stage FIR filter 4-1 having a coefficient set as shown in Table 1. As shown, regions with deteriorated filter inhibition characteristic are generated around the Nyquist frequency, that is, about 40 kHz to 50 kHz. Note that A/D conversion and D/A conversion in this embodiment are basically intended for applications relative to audio. Therefore, a cutoff frequency of the first-stage FIR filter 4-1 is on the order of 20 kHz (20 kHz or a little larger), while the Nyquist frequency thereof is on the order of 40 kHz (40 kHz or a little larger).

Figure 10:
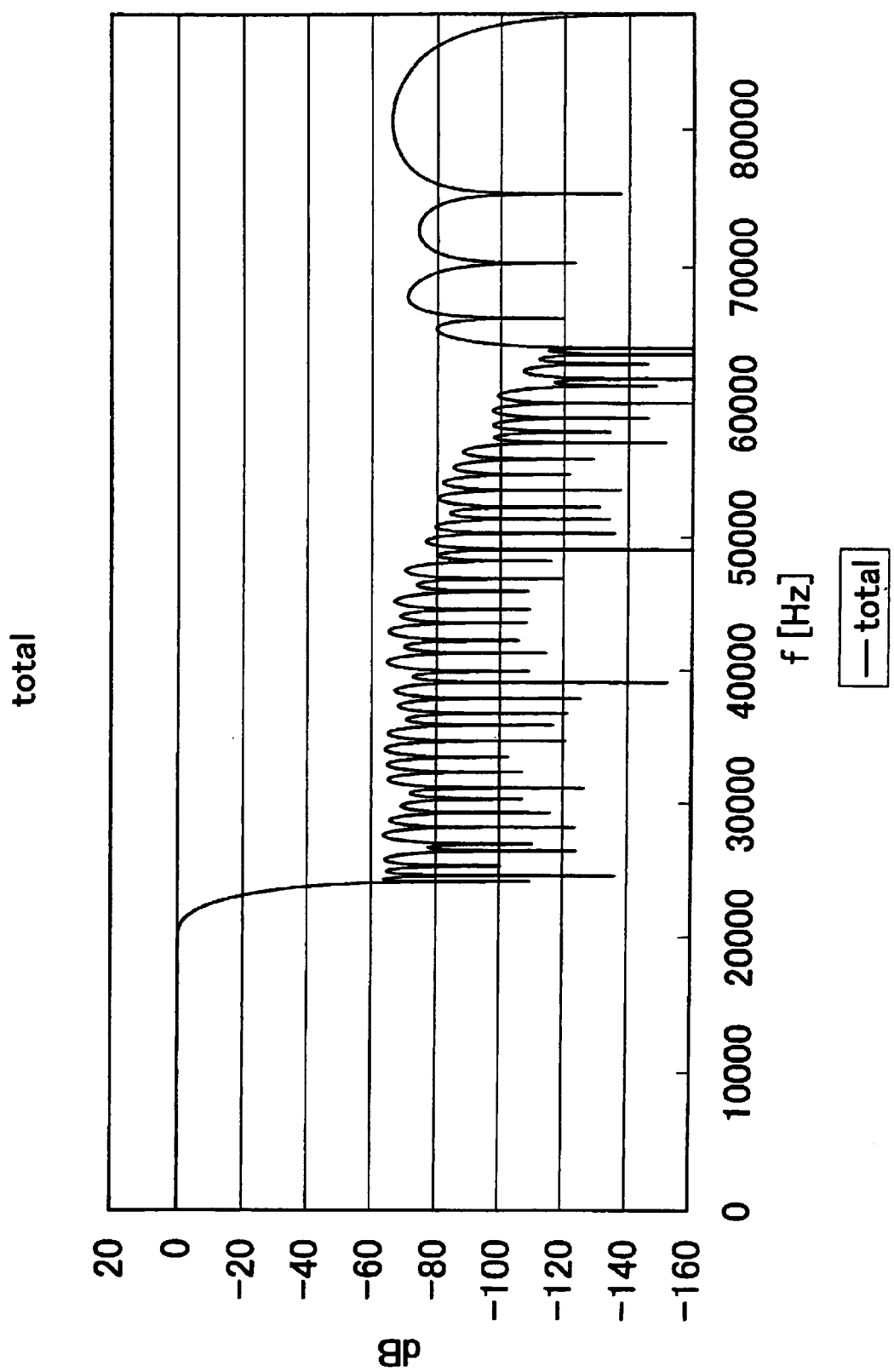
FIG. 10 is a diagram showing comprehensive filter characteristics of the first-stage FIR filter (coefficient length of 13 bits) and second-stage FIR filter according to an embodiment of the present invention.

As described above, in this embodiment, along with reduction of the coefficient of the FIR filter 4-1 from 16 bits to 13 bits, the coefficient is adjusted such that regions with insufficient attenuation due to a rounding-off errors are caused intensively around the Nyquist rate. With this arrangement, although the attenuation in an inhibition zone of the first-stage FIR filter 4-1 is only −60dB, as shown in FIG. 9, attenuation characteristics around the Nyquist frequency are improved by the second-stage FIR filter 4-2, as shown in FIG. 10, so that attenuation −63.6 dB in an inhibition zone can be achieved over the entire filter. That is, attenuation at a level similar to that which is achieved using a digital filter having a coefficient word length 16 bits can be achieved.

As described above, the interpolation filter in this embodiment comprises 2x over sampling FIR filters 4-1, 4-2 in cascade connection, in which the coefficient word length of the first-stage FIR filter 4-1 is shorter than a typical coefficient word length. Although this arrangement results in insufficient attenuation in an inhibition zone of the first-stage FIR filter 4-1, because such regions with insufficient attenuation relative to the first-stage FIR filter 4-1 are caused intensively around the Nyquist frequency and attenuation around the Nyquist frequency is enhanced by attenuating the Nyquist frequency and its close frequencies by the second-stage FIR filter 4-2, sufficient attenuation can be achieved over the entire filter.

Figure 6:
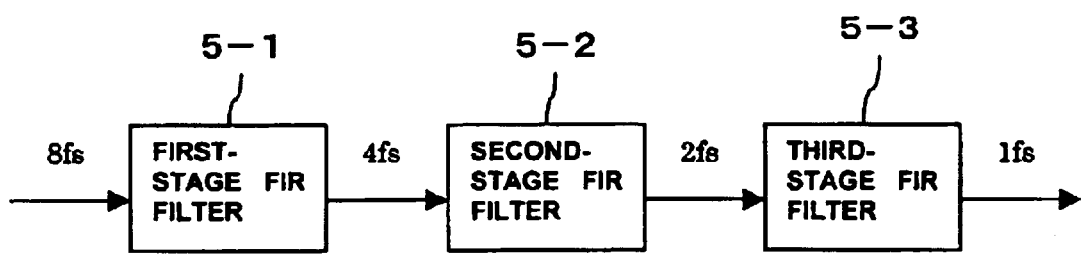
FIG. 6 is a block diagram showing a structure of a typical decimation filter.

It should be noted that the structure of a decimation filter in this embodiment is identical to the structure shown FIG. 6. In this case, the coefficient word length of the last-stage FIR filter 5-3 of the three 1/2x down sampling FIR filters 5-1, 5-2, 5-3 in cascade connection is set 13 bits, that is, shorter than a normal length. This results in insufficient attenuation in an inhibition zone of the last-stage FIR filter 5-3. However, because the coefficient of the last-stage FIR filter 5-3 is determined such that regions with insufficient attenuation are caused intensively around the Nyquist frequency so that attenuation around the Nyquist frequency can be enhanced by an immediately preceding FIR filter, namely, the second-stage FIR filter 5-2. As a result, sufficient attenuation can be achieved over the entire filter.

As described above, in this embodiment, sufficient attenuation in an inhibition zone can be realized using a coefficient word length of 13 bits, which is shorter than the conventional coefficient word length 16 bits, obviating the need to increase hardware size when a multiplier is used. The present invention can therefore reduce the period of time required to complete an operation when a parallel-shift adder is used, while suppressing increase of hardware size.

What is claimed is:

1. A decimation filter for use in A/D conversion, comprising:
   a plurality of FIR filters configured in a cascade connection, each for conducting down sampling,
   wherein
   a coefficient word length of a last-stage FIR filter is shorter than a coefficient word length which enables desirable attenuation in an inhibition zone of the last-stage FIR filter, such that there is caused a region where attenuation is insufficient in an inhibition region of the last-stage FIR filter,
   a coefficient of the last-stage FIR filter is determined such that the region where attenuation is insufficient is focused in the vicinity of a Nyquist frequency, and
   a FIR filter immediately before the last-stage FIR filter is arranged so as to attenuate the Nyquist frequency of the last-stage FIR filter.

2. The decimation filter according to claim 1, wherein
   the last-stage FIR filter and the FIR filter immediately before the last-stage FIR filter are 1/2x down sampling filters.

3. The decimation filter according to claim 2, wherein
   the last-stage FIR filter has a transmission region of about 20 kHz or smaller, which corresponds to an audible bandwidth, and an inhibition region of about 20 kHz to 40 kHz.

4. The decimation filter according to claim 3, wherein the coefficient word length of the last-stage FIR filter is 13 bits.

5. An interpolation filter for use in D/A conversion, comprising:
   a plurality of FIR filters in cascade connection, each for conducting down sampling,
   wherein
   a coefficient word length of a first-stage FIR filter is shorter than a coefficient word length which enables desirable attenuation in an inhibition zone of the first-stage FIR filter, such that there is caused a region where attenuation is insufficient in an inhibition region of the last-stage FIR filter,
   a coefficient of the first-stage FIR filter, is determined such that the region where attenuation is insufficient is caused focused in the vicinity of a Nyquist frequency, and
   a FIR filter immediately after the first-stage FIR filter is arranged so as to attenuate the Nyquist frequency of the last-stage FIR filter.

6. The decimation filter according to claim 5, wherein
   the first-stage FIR filter and the FIR filter immediately after the first-stage FIR filter are 2x down sampling filters.

7. The decimation filter according to claim 6, wherein
   the first-stage FIR filter has a transmission region of about 20 kHz or smaller, which corresponds to an audible bandwidth, and an inhibition region of about 20 kHz to 40 kHz.

8. The decimation filter according to claim 6, wherein the coefficient word length of the first-stage FIR filter is 13 bits.

* * * * *